(12) United States Patent
Garcia-Ferre et al.

(10) Patent No.: US 12,233,727 B2
(45) Date of Patent: Feb. 25, 2025

(54) CHARGING CONNECTOR FOR AN ELECTRIC VEHICLE

(71) Applicant: ABB E-mobility B.V., Delft (NL)

(72) Inventors: Francisco Garcia-Ferre, Baden (CH); Adam Michalik, Bibice (PL); Artur Zawadzki, Cracow (PL); Clemens Van-der-Veer, Zaandam (NL)

(73) Assignee: ABB E-mobility B.V., Delft (NL)

( * ) Notice: Subject to any disclaimer, the term of this patent is extended or adjusted under 35 U.S.C. 154(b) by 413 days.

(21) Appl. No.: 17/697,348

(22) Filed: Mar. 17, 2022

(65) Prior Publication Data

US 2022/0297554 A1 Sep. 22, 2022

(30) Foreign Application Priority Data

Mar. 17, 2021 (EP) ..................................... 21163123

(51) Int. Cl.
| | |
|---|---|
| *B60L 53/16* | (2019.01) |
| *B60L 53/18* | (2019.01) |
| *B60L 53/30* | (2019.01) |
| *B60L 53/37* | (2019.01) |
| *B60L 53/62* | (2019.01) |

(Continued)

(52) U.S. Cl.
CPC .............. *B60L 53/16* (2019.02); *B60L 53/18* (2019.02); *B60L 53/30* (2019.02); *B60L 53/37* (2019.02); *B60L 53/62* (2019.02); *H01R 13/502* (2013.01); *H01R 13/62* (2013.01); *H01R 13/6683* (2013.01); *H01R 13/6691* (2013.01)

(58) Field of Classification Search
CPC .......... B60L 53/16; B60L 53/11; B60L 53/10; B60L 53/00; B60L 53/62; B60L 53/60; H01R 13/502; H01R 13/62; H01R 13/6683; H01R 13/6691
USPC ........................................................ 439/345
See application file for complete search history.

(56) References Cited

U.S. PATENT DOCUMENTS 5,820,395 A * 10/1998 Hashizawa ........ H01R 13/5221
439/271
6,123,569 A * 9/2000 Fukushima ........... H02J 7/0045
439/456

(Continued)

FOREIGN PATENT DOCUMENTS

| DE | 102011004648 A1 | 8/2012 |
|---|---|---|
| DE | 102012203312 A1 | 9/2012 |
| WO | WO 2020/120288 A1 | 6/2020 |

OTHER PUBLICATIONS

European Patent Office, Extended European Search Report in European Patent Application No. 21163123.9, 7 pp. (Sep. 17, 2021).

*Primary Examiner* — Harshad C Patel
(74) *Attorney, Agent, or Firm* — Leydig, Voit & Mayer, Ltd.

(57) ABSTRACT

A charging connector for a vehicle charging station comprises a latch configured to secure a mechanical connection of the charging connector to a vehicle-side socket, the charging connector further comprising a sensor configured to indicate a secure and correct mechanical connection. The charging connector further comprises a first casing being an external casing, and a second casing, the second casing being a closed inner casing. The second casing encloses a charging connector interface to the vehicle socket, and a charging cable. The sensor is arranged outside the second casing.

16 Claims, 3 Drawing Sheets

(51) Int. Cl.
 *H01R 13/502* (2006.01)
 *H01R 13/62* (2006.01)
 *H01R 13/66* (2006.01)

(56) References Cited

U.S. PATENT DOCUMENTS

| | | | | |
|---|---|---|---|---|
| 8,016,604 B2 * | 9/2011 | Matsumoto | ........... | B60L 53/305 |
| | | | | 439/304 |
| 8,128,440 B2 * | 3/2012 | Matsumoto | ............. | B60L 53/16 |
| | | | | 439/731 |
| 8,317,534 B2 * | 11/2012 | Osawa | .................... | B60L 53/16 |
| | | | | 439/353 |
| 8,357,001 B2 * | 1/2013 | Katagiri | .................. | B60L 50/16 |
| | | | | 439/304 |
| 8,678,845 B2 * | 3/2014 | Osawa | .................... | B60L 53/16 |
| | | | | 439/352 |
| 9,088,104 B2 * | 7/2015 | Kahara | .............. | H01R 13/6397 |
| 9,106,015 B2 * | 8/2015 | Ohmura | ............. | H01R 13/6275 |
| 9,263,830 B2 * | 2/2016 | Sugiyama | ............... | B60L 53/16 |
| 9,346,368 B2 * | 5/2016 | Bito | ....................... | B60K 15/05 |
| 9,533,586 B2 * | 1/2017 | Kahara | ................... | B60L 53/16 |
| 9,601,862 B2 * | 3/2017 | Fukushima | ........... | H01R 13/516 |
| 9,755,359 B2 * | 9/2017 | Moseke | ............. | H01R 13/6275 |
| 11,283,225 B2 * | 3/2022 | Schreiber | ............... | H01R 13/64 |
| 11,383,606 B2 * | 7/2022 | Motomiya | ....... | H01R 13/62944 |
| 2002/0155751 A1 * | 10/2002 | Kato | .................. | H01R 13/5812 |
| | | | | 439/473 |
| 2013/0271075 A1 * | 10/2013 | Restrepo | ............... | H02J 7/0042 |
| | | | | 320/109 |
| 2014/0170889 A1 * | 6/2014 | Kahara | .............. | H01R 13/6397 |
| | | | | 439/352 |
| 2019/0027867 A1 * | 1/2019 | Ognjanovski | ...... | H01R 13/6683 |
| 2022/0153155 A1 * | 5/2022 | Garcia-Ferre | ........ | H01R 13/502 |
| 2023/0158904 A1 * | 5/2023 | Garcia-Ferre | ......... | H02J 7/0042 |
| | | | | 320/109 |

* cited by examiner

CHARGING CONNECTOR FOR AN ELECTRIC VEHICLE

CROSS-REFERENCE TO RELATED APPLICATIONS

This patent application claims priority from European Patent Application No. EP21163123.9, filed on Mar. 17, 2021, which is incorporated herein by reference.

FILED OF THE DISCLOSURE

The present invention relates to a charging connector for an electric vehicle, a charging station, a sensor, and a use of a sensor. More specifically, the charging connector further comprises a sensor configured to indicate a safe fastening of the connector.

BACKGROUND OF THE INVENTION

When connecting charging connectors to a charger socket of a vehicle it has to be ensured that the connection is mechanically stable. This may be accomplished by a sensor, that has an electrical connection for power supply and data or signal transmission. A sensor cable may be guided through the casing of the connector to a processing module and a power supply at the charging station and/or a processing module inside the connector casing. A casing that reduces the weight of the connector may increase the susceptibility of the connector and the sensor cable to the sensor to environmental conditions.

BRIEF SUMMARY OF THE INVENTION

In a general aspect, the present disclosure describes an improved charging connector.

The problem of the prior art connectors is solved by the subject-matter of the independent claims. Embodiments are provided by the dependent claims, the following description and the accompanying figures.

The described embodiments similarly pertain to the charging connector for a vehicle, the charging station, the sensor, and the use of a sensor. Synergetic effects may arise from different combinations of the embodiments although they might not be described in detail.

Technical terms are used by their common sense. If a specific meaning is conveyed to certain terms, definitions of terms will be given in the following in the context of which the terms are used.

BRIEF DESCRIPTION OF THE SEVERAL VIEWS OF THE DRAWING(S)

FIG. 2 shows schematic diagram of the charging connector of FIG. 1 with a sensor and a sensor cable pass-through.

DETAILED DESCRIPTION OF THE INVENTION

Figure 1:
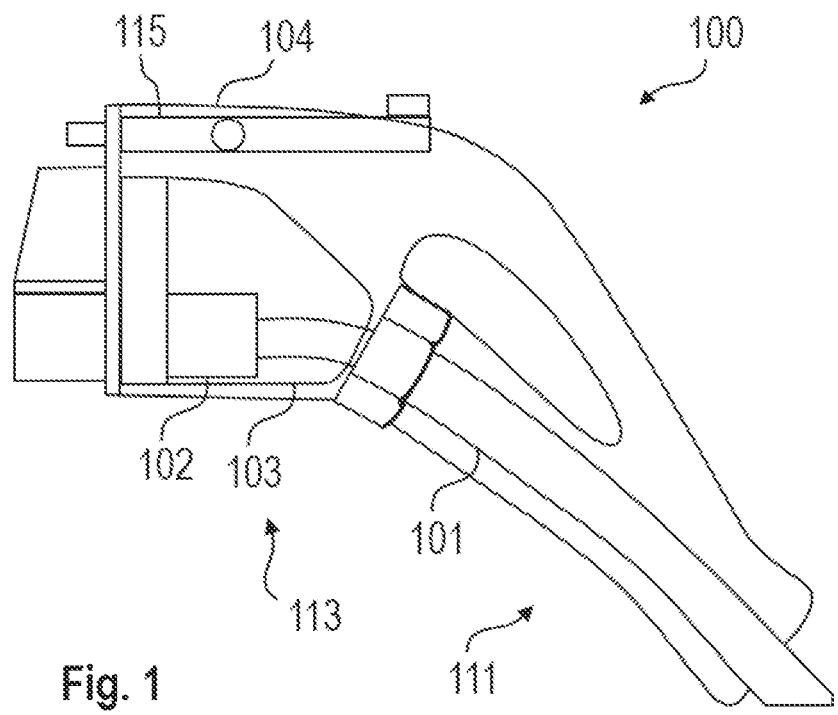
FIG. 1 shows a schematic diagram of a charging connector and a latch, in accordance with the disclosure.

According to a first aspect, a charging connector for a vehicle is provided. The charging connector comprises a latch configured to secure a mechanical connection of the charging connector to a vehicle-side socket. The charging connector further comprises a sensor configured to indicate the correct secured connection, i.e., a safe fastening of the charging connector to the vehicle. The charging connector further comprises a first casing being an external casing, and a second casing, the second casing being a closed inner casing. The first and the second casing enclose a charging connector interface to the vehicle socket, and the second casing encloses a charging cable. The sensor is arranged outside the second casing.

The charging connector provides the charging current from a charging station to the battery of an electric vehicle. Thus, "charging connector" is understood to be a handheld device such as a charging gun or charging nozzle. The counterpart of the charging connector on vehicle-side is called "socket" in this disclosure. The socket has a counter-interface to the interface of the charging connector, and the interface comprises an electrical and a mechanical part. The latch is an arrangement, which is a part of the mechanical interface of the connector and is configured to secure the charging connector mechanically to the socket of a vehicle. The latch may have moving parts and/or parts that are elastic, or it may be movable itself and is configured such that the mechanical connection can be established and released. Since the charging connector may be a part of the charging station, under the terms "cable, current, signal to/from the charging station", is understood the cable, current, signal to/from the fixed part of the charging station. This fixed part is also designated "charging post" in this disclosure.

The connector comprises a first casing, which is an outer casing and further a second casing, which is an inner casing. Between the external casing and the inner casing, there may be free space or air such that the weight of the connector is reduced, thereby providing a convenient handling and shape of the connector. The first casing may comprise channels to the environment to exchange heat via air and hence is in parts open to the environment, whereas the second, inner casing is tight and insulates its inner part from ambient conditions. The inner casing includes a charging cable and a connector interface to the vehicle socket. The second casing is an important part of the connector as it insulates the ambient influences such as dirt, moisture, water etc. from the high current parts in the area of the contacts. A further, third casing may insulate the contacts of the wires of the cable. The external casing therefore can be seen as a cover or a shell that may not be integral with the second casing.

According to an embodiment, the charging connector comprises a sensor cable comprising a data wire and/or a power wire. The sensor cable is located at least partly inside the second casing configured to transmit data from and/or power to the sensor. The sensor cable may arranged such that it is guided from the fixed station to the charging connector, and together with the charging cable to the inside of the second casing. The sensor cable may include a data wire and/or a power supply wire and join the charging cable for charging the battery of the vehicle. This is achieved best at a location where the sheathing of the inner cables or wires ends. Such a location is inside the second casing. In this way, the inner cables or wires and the sensor cable can be installed as a combined cable that is conducted to the back end of the connector and further to the fixed part of the charging station. A sensor cable is defined here to be a cable for the transmission of signal or data from or to the sensor, and/or power to the sensor. The sensor cable or wire may end at the sensor or sensor electronics in case of a wired connection. In another case, it may end at a wireless interface so that it is not attached to the sensor or sensor electronics outside the inner casing as described in more detail below.

Guiding the sensor cable into the inner casing has the advantage that both, sensor and charging cables can be guided together, and even be guided together up to the contactor area, thereby facilitating the guiding of the cables as one single cable instead of two separated cables, and especially without cutting the sheathing to lead out the sensor cable.

According to an embodiment, the second casing comprises a sealing pass-through configured to guide the sensor cable from the inside of the second casing to the outside of the second casing. "Outside the second casing" means that it is guided to the sensor or sensor electronics at or near the sensor, inside the external casing. Since the insulation characteristics of the inner casing shall be maintained, the pass-through has to be realized in a sealing way such that the inner casing is still tight, protecting its inside from ambient conditions.

According to an embodiment, the charging connector comprises a wireless interface configured to connect the sensor wirelessly to a processing circuit and/or a power supply. The processing circuit may be, for example, a PCB (printed circuit board) with a wireless communication module, A/D conversion capabilities, or capabilities for signal processing, data evaluation, etc. The processing circuit may be mounted inside the inner casing and may provide the counter-part of the wireless interface to the sensor-side wireless interface. The wireless interface is attached, for example, at the outside surface of the inner casing facing the wireless interface at the inside or being at least in the vicinity to it. The wireless interface may comprise, for example, NFC (near field communication) devices such as RFID (radio-frequency identification) antennas, Bluetooth or another means to transmit power and/or data wirelessly, for example, by using induction.

According to an embodiment, the charging connector comprises a wireless interface configured to connect the sensor wirelessly to a processing circuit and/or a power supply external of the charging connector. Particularly, the sensor may be connected wirelessly to the fixed part of the station. In one example, an electronic module near or at the sensor inside the external casing and outside the inner casing may comprise a re-chargeable power storage, such as a capacitor or a battery. The charging station may comprise a wireless interface for data and for power, for example an inductive interface. The power storage may be loaded when the charging connector is plugged into the socket of the fixed part of the charging station. In this case, no sensor cable is necessary at all.

Any combination of the presented embodiments would be possible. For example, a data transmission over a wireless interface to the station and an inductive or wired power transfer for supplying the sensor with power from inside the inner casing would be possible, such that only a sensor power supply cable between the station and the interface in the inner casing is necessary. As another example, the connector may comprise the pass-through and/or the wireless interface. For example, the communication may be accomplished wirelessly, and the power transmission may be accomplished wired using the pass-through, or vice versa.

According to an embodiment, the electronic parts for operating the sensor that are located outside the second casing are sealed. This may include the cables and especially the connections between a cable and an electronic device. As an example, the electronic module and/or the sensor are sealed. The sealing may relate to the PCB or other types of above-mentioned electronic modules, to an antenna of the wireless interface, to cables and cable connections and/or to the sensor or parts of the sensor. In case of having a pass-through, the sealing may be implemented such that there is a continuous sealing from the pass-through to the electronic module and/or the sensor. The sealing may be achieved by varnish, resin or other suitable material. This applies also to the electronic module, the sensor or parts of the sensor and cables.

According to an embodiment, the charging connector comprises an electronic module, and the sensor is mounted on or integrated into the electronic module. The electronic module may be a for example a PCB, a foil, an aluminum plate, e.g. coated aluminum plate, or it may be arrangement without any substrate, e.g. just based on wires. The electronic module may provide a power supply circuit, electronics for controlling the sensor, for evaluating and/or outputting the signal in analog or digital form to a signal line. When the sensor and the electronics are integrated on one module, only one constructional measure has to be taken for installing the sensor and the electronics, and only one cable to this module has to be foreseen and guided to supply sensor and electronics with power and to transmit data or signals.

According to an embodiment, the sensor is arranged inside the external casing of the charging connector. "Inside" means especially that the sensor is in a space that is encased by the external casing. However, the sensor may also be embedded in the casing, such that it is a part of the casing covered completely or partly with the material of the casing. By arranging the sensor inside the external casing, the sensor is protected at least to a certain degree from ambient conditions such as dirt and water. The sensor may also be arranged at the external casing of the charging connector. The expression "at the external casing" includes positions inside or outside the external casing. The sensor may be located at the front side of the charging connector, that is, attached to the casing or embedded in the casing on the side facing the socket of the vehicle. For example, the sensor measures a distance to the counter-interface such as a width of the gap between them. Hereby, the sensor may be arranged inside the casing or on the outside. Suitable positions for the sensor at the external casing are, for example positions that are near moving parts of, e.g., the latch, when the mechanical interfaces are connected to each other, or positions where the distance to the counter-interface can be measured. A sealing may be applied also for such locations. In case of wireless connection, these locations are independent of the cabling.

According to an embodiment, the sensor is a proximity sensor. A proximity sensor may be a mechanical sensor or switch, an optical sensor, a Hall sensor, an inductive sensor, a magnetic sensor, a capacitive sensor, an ultrasonic sensor, a Lidar or a radar sensor etc. For example, a Hall sensor is particularly suitable sensor due to its robustness against environmental influences as dirt, moisture or water. In case of a Hall sensor, a magnet may be mounted on the mechanical socket interface of the vehicle. However, preferably the sensing is independent of the vehicle-side socket construction. Therefore, the magnet may be mounted on a movable part such as the latch itself, or a movable rod or a plane part that is shifted or pressed when the mechanical connection is established, such that the magnet faces the Hall sensor. As another example, the sensor may be a mechanical switch. The switch is arranged such that when connecting the charging connector to the vehicle, the switch is actuated, i.e. opened or closed, and the correct position is detected. For example, the switch is actuated when the connector is sliding into the socket and reaches an end position. The switch may be integrated into or attached to the external or inner casing. Alternatively, it may be mounted on the latch. In this case, it may be engaged, when a part of the socket is introduced in the latch or a mechanical fastening mechanism is activated when plugging in the charging connector. The switch establishes a galvanic connection as soon as the latch is in the correct position with respect to the connection to the mechanical interface.

According to an embodiment, the charging connector comprises acoustical and/or optical means configured to indicate a correct or non-correct mechanical connection of the charging connector with the socket. The user thus is shown the correct fit of the charging connector. Also these components may be supplied and controlled wirelessly, e.g. over the same wireless interface or a further wireless interface. If the electronic module is inside the second casing, the wireless connection may be established from this electronic module to the components or electronics that drive these components. In case of a wired connection, the same wired interface as for the power and signal cable is used or an interface directly from the electronic module, where the sensor evaluation is implemented on. The optical and acoustic components may, alternatively be implemented on the electronic module. In any of these cases, they may be sealed, either separately or in a continuous way with further components.

According to an embodiment, the charging connector comprises a charging cable, the charging cable comprising a charging wire configured to conduct charging current to a vehicle, wherein the charging wire is configured to conduct the charging current only when the sensor has detected a correct mechanical connection. That is, the charging cable is connected to the power source of the charging station only if the connection is correct. In this case, the sensor cable may be configured to conduct a control signal for controlling the charging current over the wireless interface or the sealing pass-through, or a control signal may be transmitted wirelessly over a wireless connection to the charging station.

According to a further aspect, a charging station is provided, wherein the charging station comprises a charging connector as described herein. The charging station may be an electrical vehicle charging station. The charging station may consist of a fixed part connected to a power source, e.g. a public or private power grid, and the charging connector that is connected to the fixed part by a cable. The cable comprises at least a wire for the vehicle charging current and at least a wire for supplying a sensor and sensor electronics in the charging connector with power and for transmitting sensor data and/or signaling data.

According to an embodiment, the charging station comprises a control unit and/or a power supply unit configured to transfer energy to a sensor of the charging connector and/or to exchange signals with the sensor of the charging connector. The charging station may further comprise means to indicate optically or acoustically the correct mechanical connection. In particular, the transfer of energy and the transmission and reception of signals passes a wireless communication interface and/or a pass-through at the second casing as describe herein.

According to a further aspect, a sensor configured to detect a correct connection of a charging connector in a charging connector is provided. The sensor may be a proximity sensor such as a mechanical sensor or switch, an optical sensor, a Hall sensor, an inductive sensor, a magnetic sensor, a capacitive sensor, a ultrasonic sensor, a Lidar or a radar sensor. Therefore, the sensor may be configured, e.g. to measure a distance, detect a contact, to measure a voltage or current, or measure directly or indirectly values or changes of values of parameters describing physical, electrical, magnetic or electromagnetic characteristics.

According to a further aspect, a use of such a sensor configured to detect a correct connection of a charging connector with a first and a second casing as described herein is provided.

A method for detecting a secure mechanical connection of a charging connector in a charging connector with a first and a second casing to a vehicle may be formulated, wherein. the mechanical connection is established using a latch, the detection is performed using a sensor, and the charging connector comprises a first external casing and a second inner casing. The method comprises the following steps: connecting the charging connector to the vehicle, detecting, by the sensor, the correct mechanical connection of the charging connector, and transmitting, by the sensor, a signal indicating the correct mechanical connection, wherein the sensor power and the sensor data or signal are passed to the sensor located outside the second casing. A sensor cable on which data and/or power is conducted may end at the inside of the second casing or guided through the inner casing. Alternatively or additionally, the data and/or power may be provided wirelessly to/from the charging station.

These and other features, aspects and advantages of the present invention will become better understood with reference to the accompanying figure and the following description. Identical or equivalent elements are in principle provided with the same reference signs.

Figure 4:
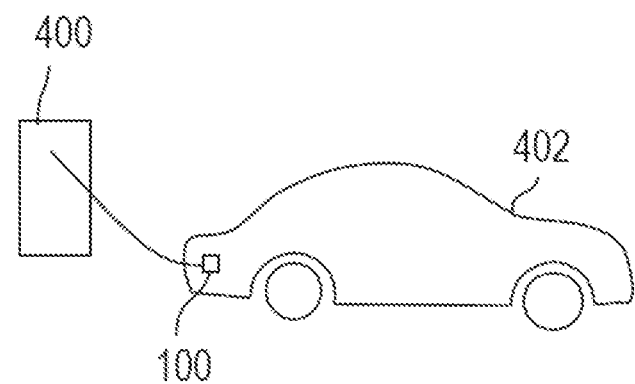
FIG. 4 shows schematic diagram of a charging station connected to a vehicle in accordance with the disclosure.

FIG. 1 shows a charging connector design that is suitable for the invention. Cable 101 is linked to a contact holder 102 inside of an inner casing 103. The function of the inner casing 103 is to ensure electrical insulation, mechanical strength, prevent water and dirt contamination. For this reason, casing 103 is massively sealed, and in some designs also nearly completely potted structure. Also the contact holder 102 can be treated in this way. The combination of components 102 and 103 is further enclosed in external casing 104. For example, in the specific case of connectors type "CCS-1", which are connectors used in North America, the connector contains an additional "latch element" 115. This element is a lever used to lock the connector to the car, and facilitate the communication between car and charging post so that the charging session can begin. Cable 101 is further conducted from the front portion 113 to the back portion 111 of the charging connector 100, from which it lead to a charging station 400 as shown in FIG. 4.

The purpose of the overall design is to have a triple mechanical protection of the contacts that is guaranteed by the contact holder 102, the inner casing 103, and the external casing 104, and that is further guaranteed by a double IP protection that is guaranteed by the contact holder 102 and the inner casing 103. Another reason for separating casing 103 and 104 is weight. The severe functional requirements on inner casing 103 lead to fairly robust and heavy design, that is also potentially "sealed for life". On the other hand, the bulkier external casing 104 is built in fairly light manner, with focus on weight reduction and comfort. A challenge regards the way in which the latch 115 may guarantee the communication between the car 402 and the charging station 400 or "charging post". Indeed, the good mechanical isolation of the contact elements comes at the expense of good insulation of the latch 115 from the cable 101, which is the component eventually carrying the signal towards the charging station 400.

Figure 2:
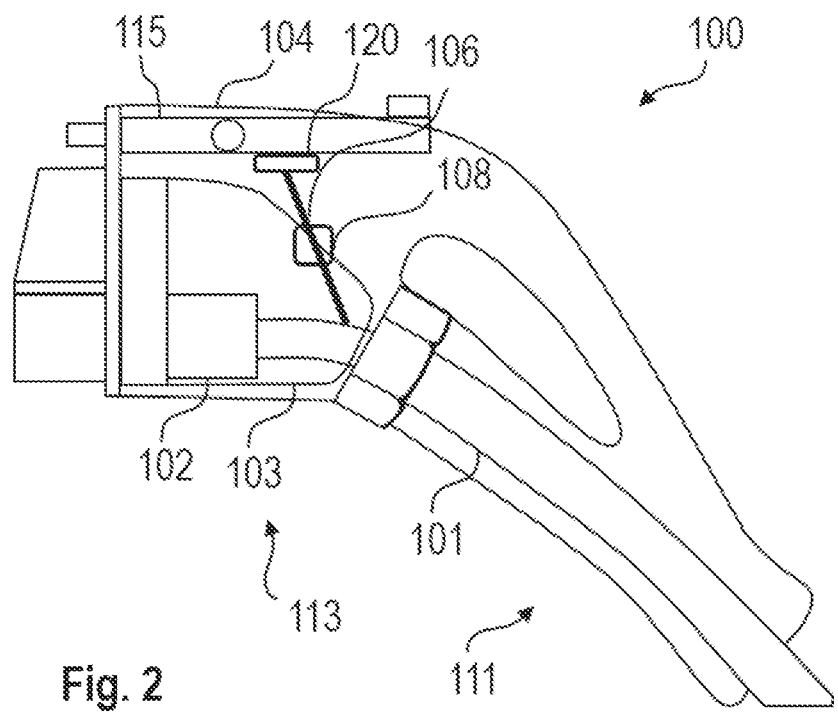

FIG. 2 shows an schematic diagram of an embodiment, where the problem is solved by a sensor that may detect the position of the latch 115 outside of the inner casing 103 and inside of the external casing 104. The sensor 120 could be, for example, a proximity sensor as described above. For example, it may be a Hall sensor that could detect magnets present in the latch 115, or any other sensor type. The signal could be transmitted towards the cable 101 via additional cables 106 that would connect the sensor 120 that may be embedded, for example, in a printed circuit board and the cable 101 going through a pass-through connection 108 with adequate IP protection rating.

Figure 3:
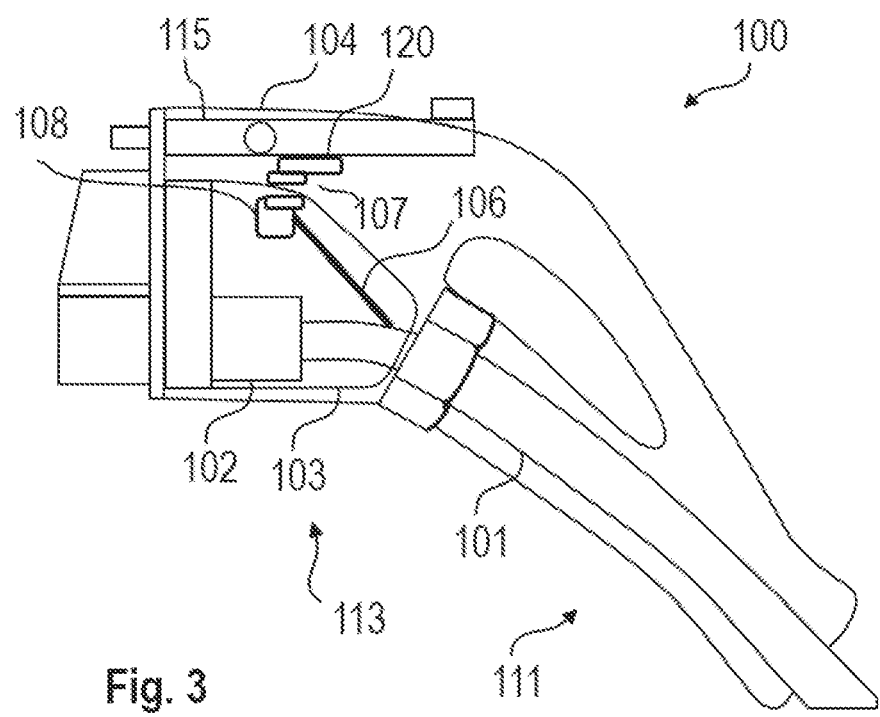
FIG. 3 shows schematic diagram of the charging connector of FIG. 1 with a sensor and a wireless interface.

FIG. 3 shows an schematic diagram of a further embodiment, in which the signal is transmitted towards the inside of the inner casing 103 in a wireless manner via a wireless signal emitter 107, for example an NFC connection with an RFID antenna, towards the processing unit 108. The latter would be connected with a cable 106 to the main cable 101 within the inner casing 103. In such way, a mechanical pass through connection is not required.

FIG. 4 shows a schematic diagram of a charging station 400 where the charging connector 100 is connected to a socket of the vehicle 402.

Figure 5:
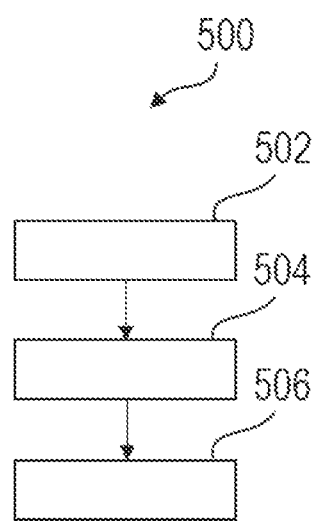
FIG. 5 shows a flow diagram of a method in accordance with the disclosure.

FIG. 5 shows a flow diagram of a method 500 for detecting a secure mechanical connection of a charging connector. The method 500 comprises the following steps. In a first 502 step, the charging connector 100 is connected to a vehicle 402. In a second step 504, the sensor detects the correct mechanical connection of the charging connector 100. In a third step, 506, the sensor sends a signal indicating the correct mechanical connection. This step may further comprise an acoustic or optical indication. The charging station 400 may receive the signal and may switch on the charging current. Sensor power and sensor signal are passed from a sensor cable inside the second casing to the sensor outside the second casing. The sensor cable may end inside the inner casing in case of a wireless connection or may be attached to the sensor or a sensor electronics. Additionally or alternatively, the power and the signal may be transmitted wirelessly to the charging station.

Other variations to the disclosed embodiments can be understood and effected by those skilled in the art in practicing the claimed invention, from the study of the drawings, the disclosure, and the appended claims. In the claims the word "comprising" does not exclude other elements or steps and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

REFERENCE SIGNS

100 Charging connector
101 Charging cable
102 Contact holder/third casing
103 Inner casing/second casing
104 Outer casing/first casing
106 Sensor cable/signaling, data, power supply for/from the sensor
107 Wireless interface for signaling, data, power for/from the sensor
108 Processing unit/PCB for sensor data and power supply
111 Front portion of charging connector 100
113 Back portion of charging connector 100
115 Latch
120 Sensor
400 Charging station
402 Electrical vehicle
500 Method
502 Method, first step
504 Method, second step
506 Method, third step

The invention claimed is:

1. A charging connector for a vehicle charging station, comprising:
a latch configured to secure mechanical connection of the charging connector to a vehicle-side socket, the charging connector further comprising a sensor configured to indicate the correct secured mechanical connection of the charging connector, wherein the charging connector further comprises a first casing being an external casing enclosing a second casing, the second casing being a closed inner casing;
the first and the second casing enclose a charging connector interface to the vehicle-side socket;
the second casing encloses a charging cable and a cable of the sensor; and
wherein the sensor is arranged outside the second casing.

2. The charging connector according to claim 1, wherein the charging connector comprises the sensor cable comprising a data wire and/or a power wire configured to carry data and/or power of the sensor, wherein the sensor cable is located at least partly inside the second casing.

3. The charging connector according to claim 2, wherein the second casing comprises a sealing pass-through configured to guide the sensor cable from the inside of the second casing to the outside of the second casing.

4. The charging connector according to claim 2, wherein the charging connector further comprises:
a charging cable, wherein the charging cable comprises a charging wire configured to conduct charging current to a vehicle,
wherein the charging wire is configured to conduct the charging current only when the sensor has detected a correct mechanical connection;
wherein the sensor cable is configured to conduct a control signal for controlling the charging current over the wireless interface, the sealing pass-through, or to transmit a control signal wirelessly over a wireless connection to the charging station.

5. The charging connector according to claim 1, wherein the charging connector comprises a wireless interface configured to connect the sensor wirelessly to a processing circuit inside the second casing and/or a power supply.

6. The charging connector according to claim 1, wherein the charging connector comprises a wireless interface configured to connect the sensor wirelessly to a processing circuit and/or a power supply external of the charging connector.

7. The charging connector according to claim 1, wherein the sensor and/or electronic parts for operating the sensor that are located outside the second casing are sealed.

8. The charging connector according to claim 1, wherein the charging connector comprises an electronic module, and the sensor is integrated in or mounted on the electronic module.

9. The charging connector according to claim 1, wherein the sensor is arranged inside the external casing of the charging connector or at the external casing of the charging connector.

10. The charging connector according to claim 1, wherein the sensor is a proximity sensor.

11. The charging connector according to claim 1, wherein the charging connector comprises acoustical and/or optical means configured to indicate a correct or non-correct mechanical connection of the charging connector with the socket.

12. A charging station, comprising a charging connector, the charging connector comprising:
a latch configured to secure mechanical connection of the charging connector to a vehicle-side socket, the charging connector further comprising a sensor configured to indicate the correct secured mechanical connection of the charging connector;
wherein the charging connector further comprises a first casing being an external casing enclosing a second casing, the second casing being a closed inner casing;
the first and the second casing enclose a charging connector interface to the vehicle-side socket;
the second casing encloses a charging cable and a cable of the sensor; and
wherein the sensor is arranged outside the second casing.

13. The charging station according to claim 12, further comprising a control unit configured to exchange signals with the sensor of the charging connector.

14. The charging station according to claim 13, further comprising a power supply unit configured to transfer energy to the sensor of the charging connector.

15. The charging station according to claim 12, wherein the sensor is configured to detect a correct connection of a charging connector in a charging connector with a first and a second casing.

16. A charging connector for a vehicle charging station, comprising:
a latch configured to secure mechanical connection of the charging connector to a vehicle-side socket, the charging connector further comprising a sensor configured to indicate the correct secured mechanical connection of the charging connector, wherein the charging connector further comprises a first casing being an external casing, and a second casing, the second casing being a closed inner casing, wherein the charging connector further comprises a data wire and/or a power wire configured to carry data and/or power of the sensor, wherein the sensor cable is located at least partly inside the second casing;
the first and the second casing enclose a charging connector interface to the vehicle-side socket;
the second casing encloses a charging cable, wherein the sensor is arranged outside the second casing,
wherein the charging cable comprises a charging wire configured to conduct charging current to a vehicle,
wherein the charging wire is configured to conduct the charging current only when the sensor has detected a correct mechanical connection, and
wherein the sensor cable is configured to conduct a control signal for controlling the charging current over the wireless interface, the sealing pass-through, or to transmit a control signal wirelessly over a wireless connection to the charging station.

* * * * *